(12) United States Patent
Morishita et al.

(10) Patent No.: US 11,139,143 B2
(45) Date of Patent: Oct. 5, 2021

(54) SPIN POLARIMETER

(71) Applicant: HITACHI HIGH-TECH CORPORATION, Tokyo (JP)

(72) Inventors: Hideo Morishita, Tokyo (JP); Teruo Kohashi, Tokyo (JP); Toshihide Agemura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/050,955

(22) PCT Filed: May 22, 2018

(86) PCT No.: PCT/JP2018/019684
§ 371 (c)(1),
(2) Date: Oct. 27, 2020

(87) PCT Pub. No.: WO2019/224919
PCT Pub. Date: Nov. 28, 2019

(65) Prior Publication Data
US 2021/0074509 A1 Mar. 11, 2021

(51) Int. Cl.
*H01J 37/244* (2006.01)
*G01N 23/2251* (2018.01)
*H01J 37/22* (2006.01)

(52) U.S. Cl.
CPC ........ *H01J 37/244* (2013.01); *G01N 23/2251* (2013.01); *H01J 37/22* (2013.01); *G01N 2223/07* (2013.01); *G01N 2223/507* (2013.01); *H01J 2237/24557* (2013.01)

(58) Field of Classification Search
CPC .......... H01J 37/244; H01J 37/00; H01J 37/02; H01J 37/22; H01J 37/28; H01J 37/18; H01J 37/26; H01J 2237/24557; G01N 23/2251; G01N 2223/07; G01N 2223/624; G01N 2223/1016; G01N 2223/102
USPC .......................... 250/305, 306, 307, 310, 311
See application file for complete search history.

(56) References Cited

U.S. PATENT DOCUMENTS

| 4,658,138 A * | 4/1987 | Koike | .................... H01J 37/268 250/306 |
| 2015/0060695 A1 | 3/2015 | Man et al. | |
| 2020/0035443 A1* | 1/2020 | He | .......................... H01J 37/09 |

FOREIGN PATENT DOCUMENTS

JP 2015-50069 A 3/2015

\* cited by examiner

*Primary Examiner* — Jason L McCormack
(74) *Attorney, Agent, or Firm* — Volpe Koenig

(57) ABSTRACT

A spin polarimeter includes: a particle beam source or a photon beam source that is a probe for a sample; a sample chamber in which the sample is accommodated; a spin detector that includes a target to be irradiated with an electron generated from the sample by a particle beam or a photon beam from the probe, and a target chamber in which the target is accommodated, and is configured to detect a spin of the sample by detecting an electron scattered on the target; a first exhaust system that is configured to exhaust the sample chamber; a second exhaust system that is configured to exhaust the target chamber; and an orifice that is disposed between the target chamber and the sample chamber.

13 Claims, 11 Drawing Sheets

[FIG. 1]
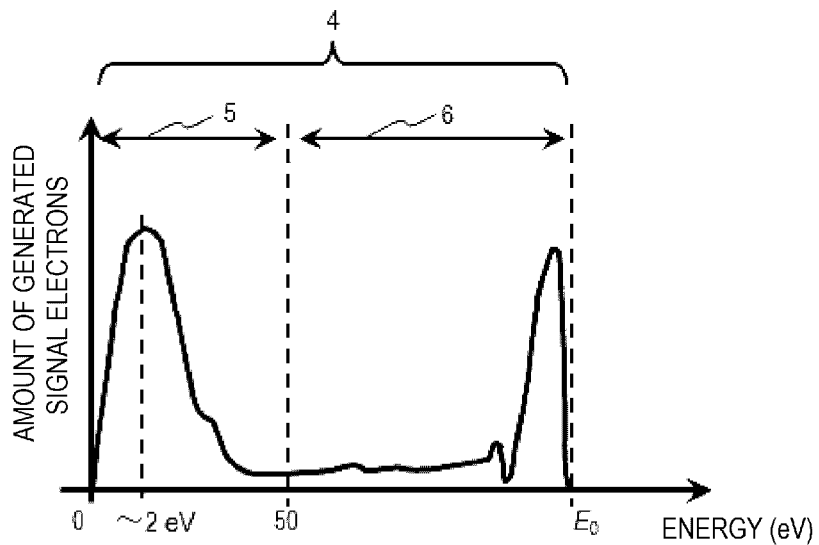
[FIG. 2]
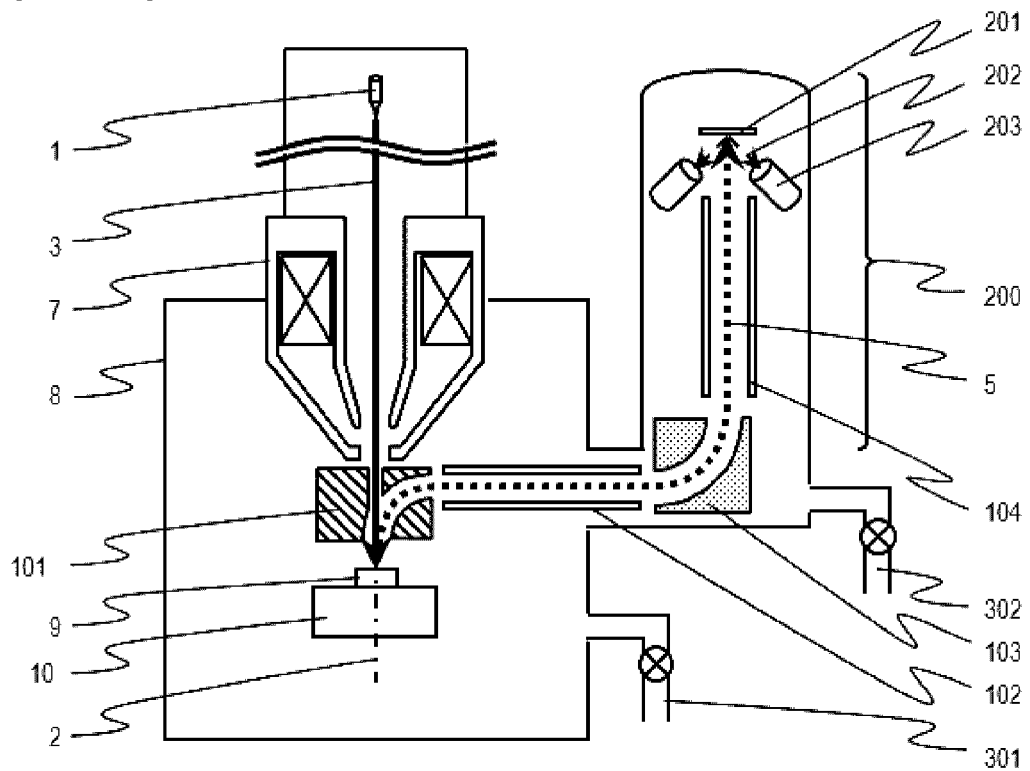

[FIG. 3]
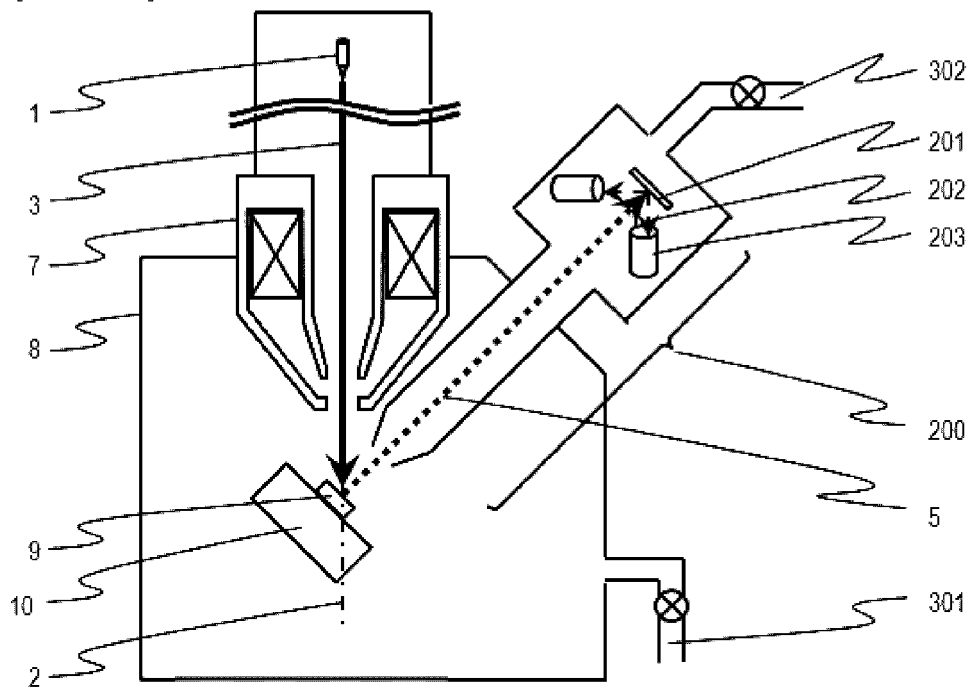
[FIG. 4]
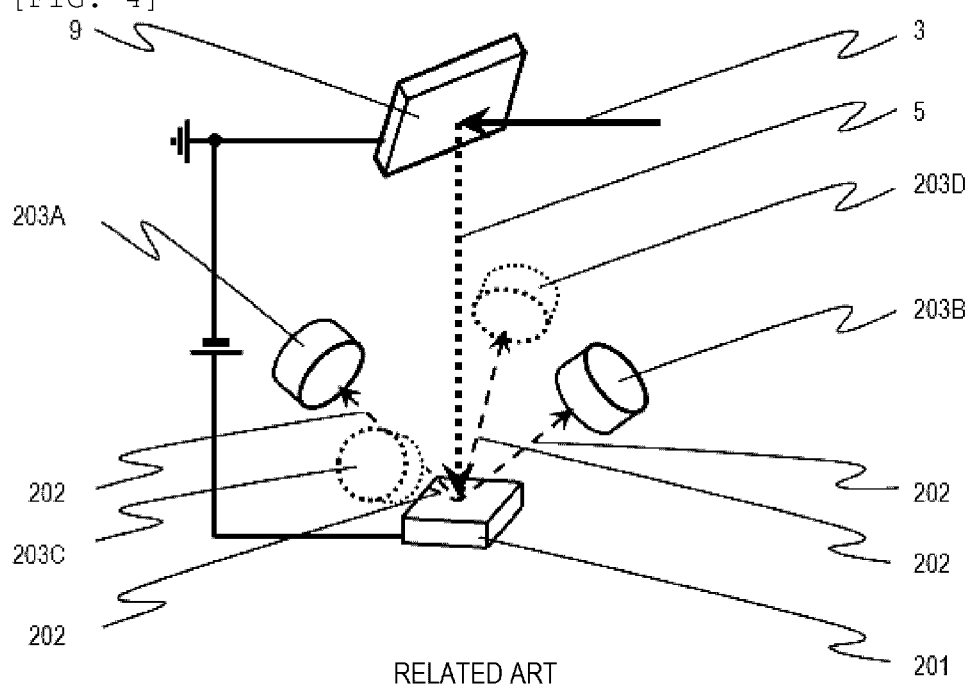
RELATED ART

[FIG. 5]
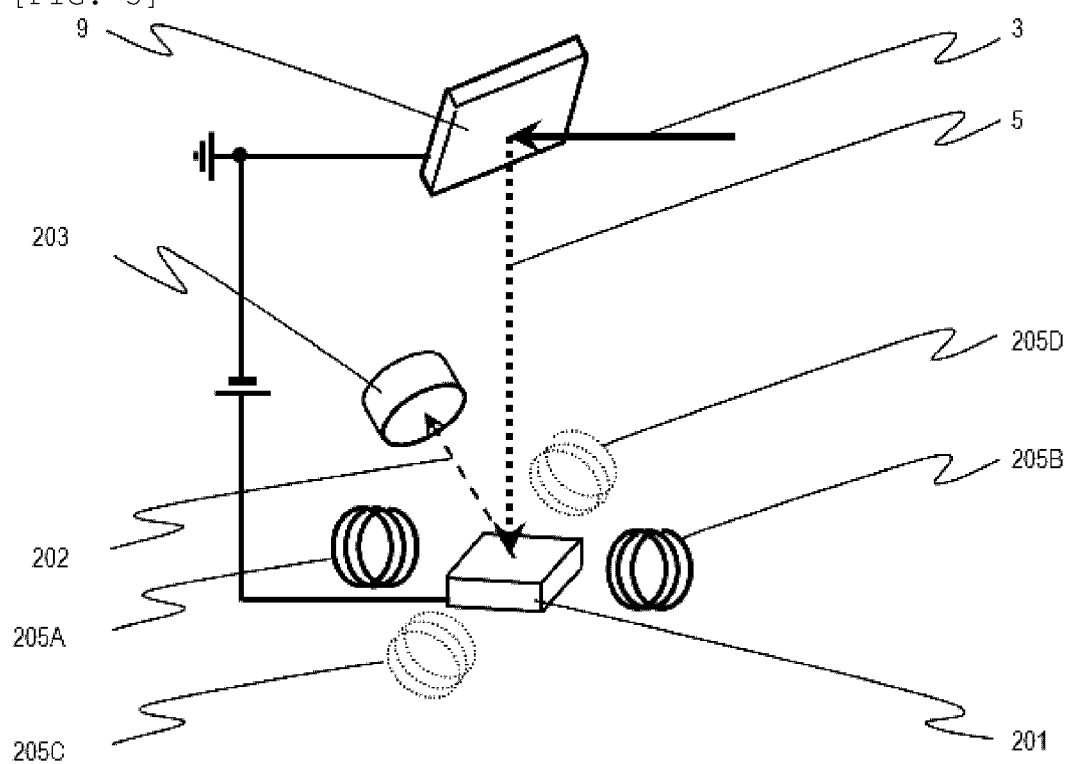
RELATED ART

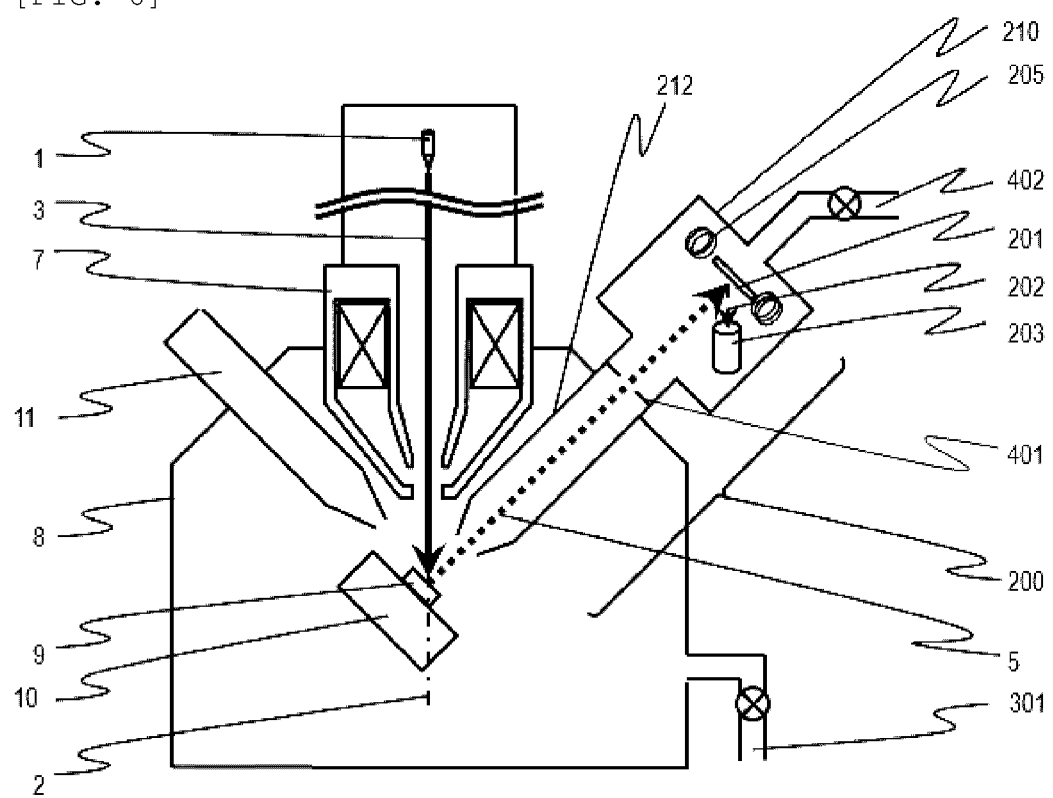
[FIG. 6]

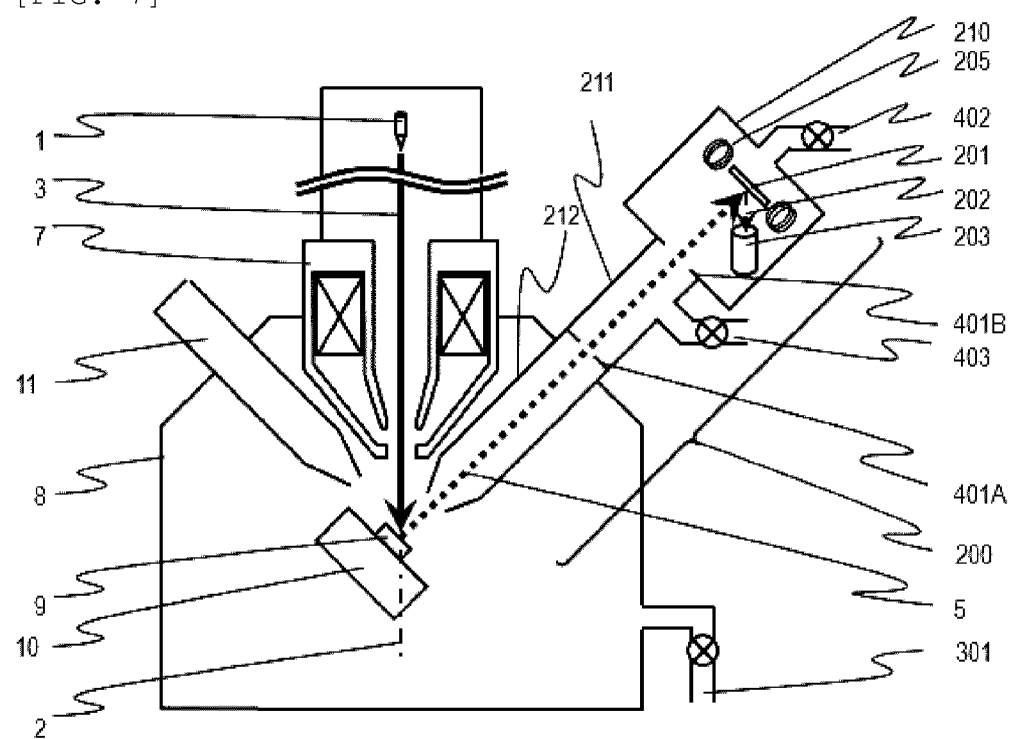
[FIG. 7]

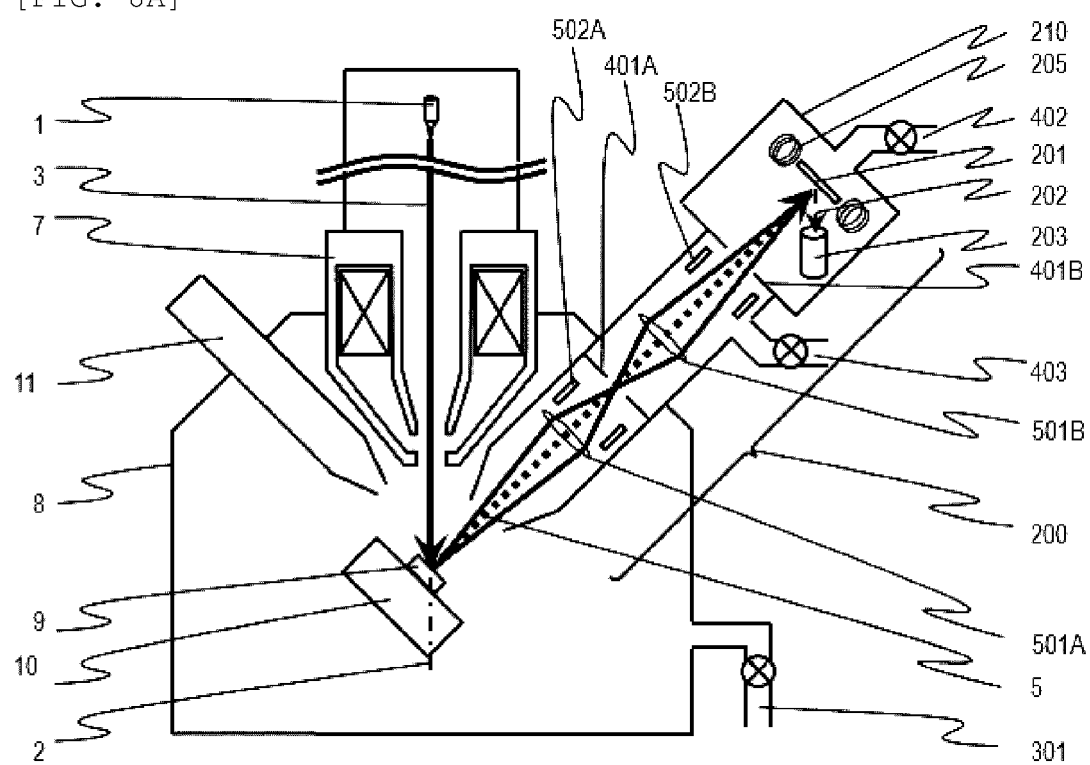
[FIG. 8A]

[FIG. 8B]
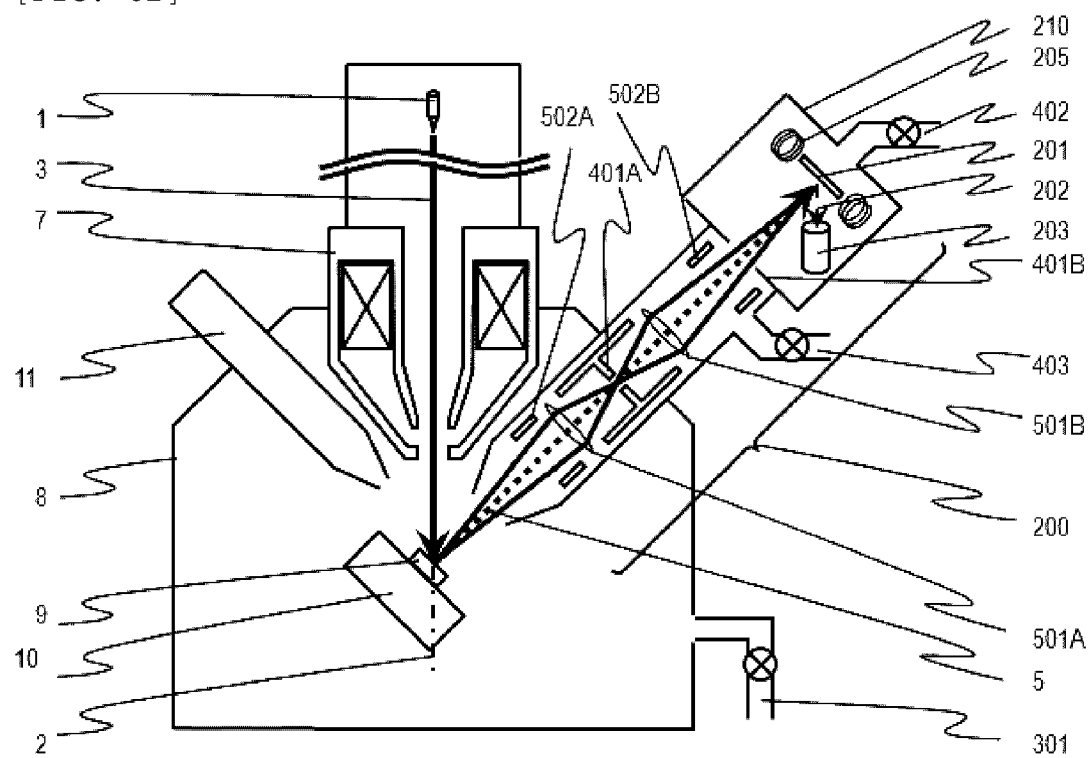

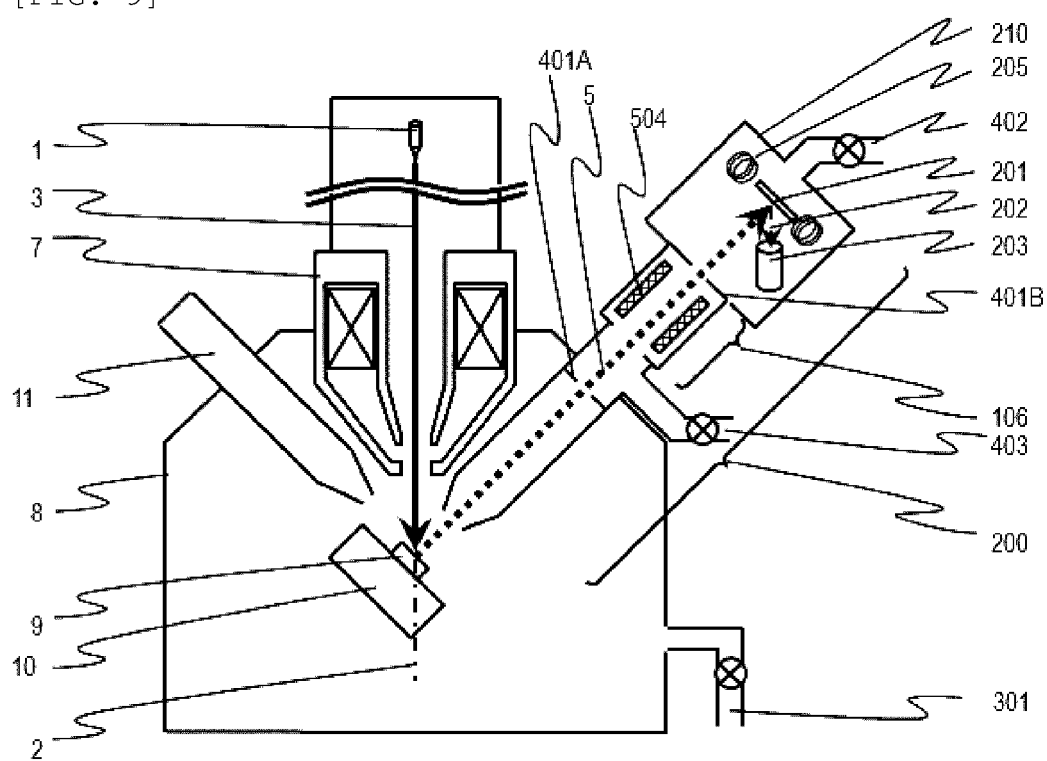
[FIG. 9]

[FIG. 10]
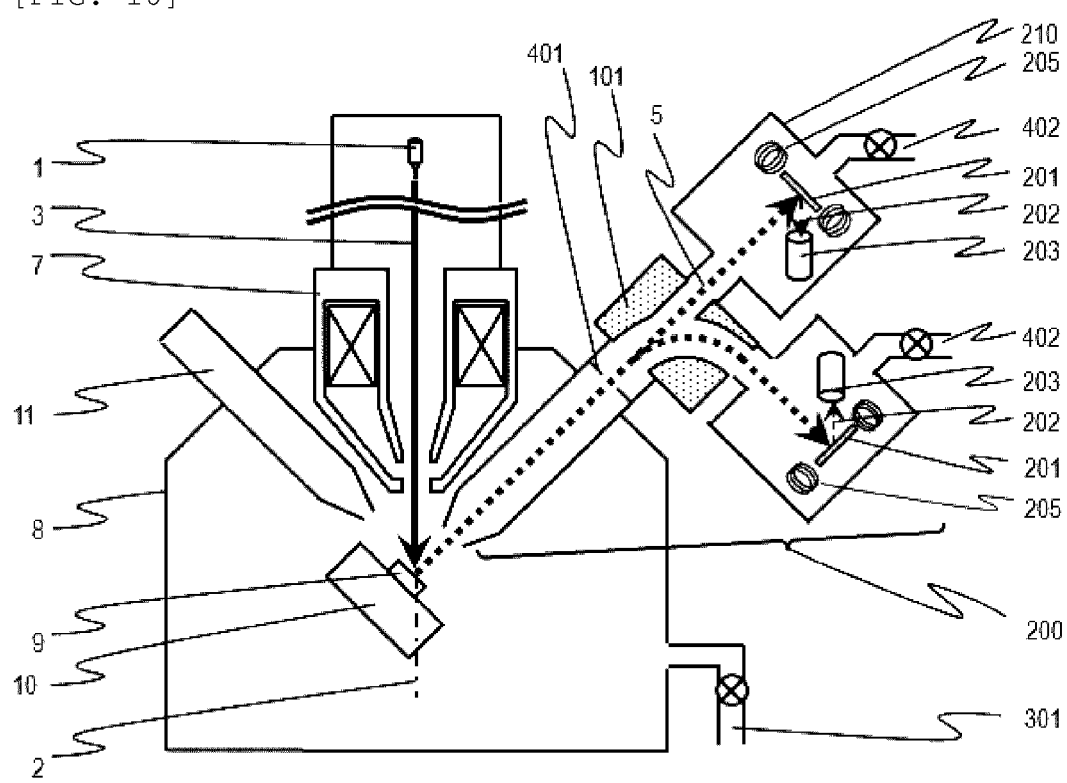

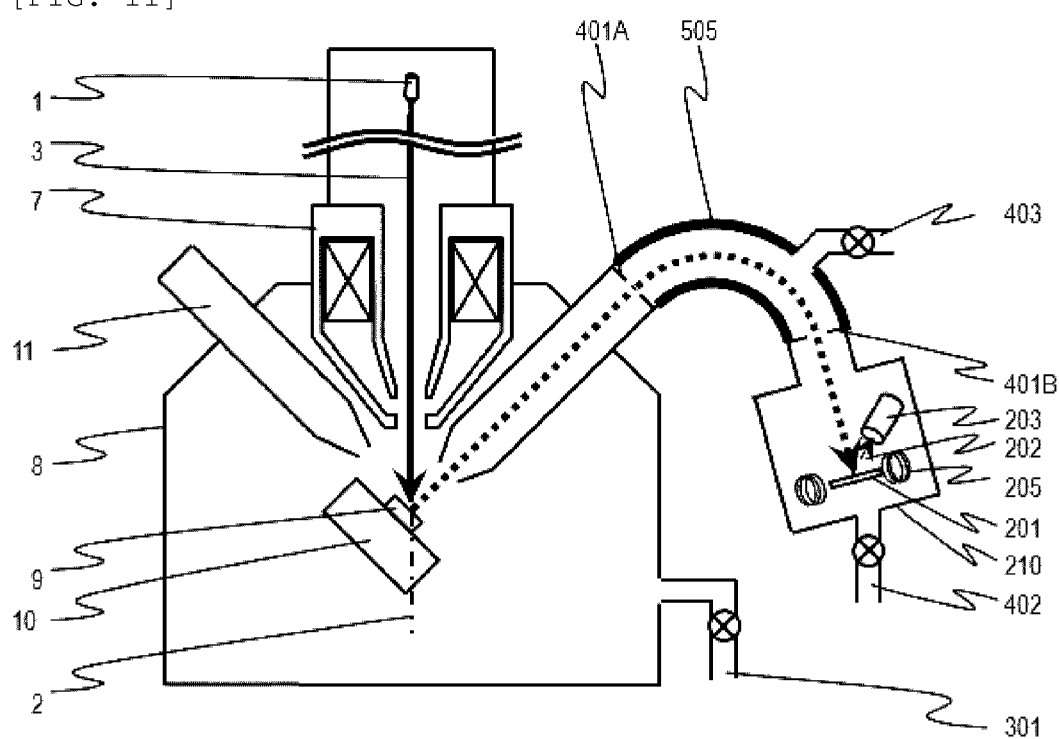
[FIG. 11]

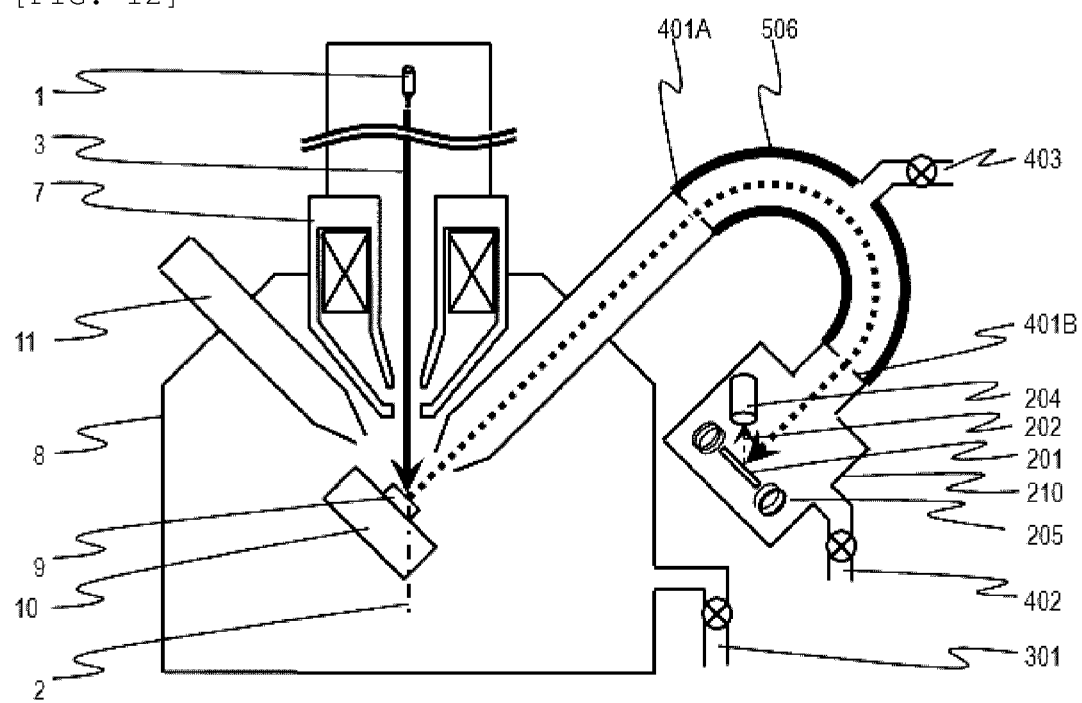
[FIG. 12]

SPIN POLARIMETER

TECHNICAL FIELD

The present invention relates to a spin polarimeter.

BACKGROUND ART

A scanning electron microscope (hereinafter referred to as SEM) is an apparatus that obtains a two-dimensional image (SEM image) of a scanning region on a surface of a sample by detecting signal electrons generated at each irradiation position when the sample is irradiated and scanned with a focused electron beam, and displaying a signal intensity of each point in synchronization with a scanning signal of the emitted electron beam. As an apparatus for observing and analyzing minute regions, the SEM is used by users in a wide range of fields.

Further, as an apparatus for observing a magnetic wall and a magnetic domain on a surface of a bulk sample of a magnetic material such as a steel material and a magnet material, a spin polarized scanning electron microscope (hereinafter referred to as spin SEM) equipped with a spin detector on the SEM is known. The apparatus for observing a magnetic wall and a magnetic domain includes, in addition to the spin SEM, a Kerr microscope that uses the magneto-optical Kerr effect and a magnetic force microscope which is a kind of a scanning probe microscope, while the spin SEM is a superior for measuring magnetization because the spin SEM can three-dimensionally measure magnetization of the surface of the sample with a resolution of 10 nm or less.

FIG. 1 shows an energy distribution of electrons emitted when a sample is irradiated with an electron beam. Signal electrons 4 generated on the sample by the irradiation of the electron beam are distributed in a range of 0 to $E_0$ eV. The signal electrons 4 include secondary electrons 5 with low energy and backscattered electrons 6 with high energy.

A main detection target of the spin SEM is secondary electrons of several eV or less. The spin SEM can measure a spin polarization at each irradiation position of the electron beam by detecting the secondary electrons using the spin detector, and obtain a local magnetization distribution on a sample surface of a magnetic material.

FIGS. 2 and 3 show a schematic apparatus configuration of the spin SEM. In the apparatus configuration shown in FIG. 2, secondary electrons 5 emitted from a sample 9 disposed so as to face an SEM optical axis 2 are deflected outside the optical axis by deflectors 101, 103. Specifically, the apparatus configuration shown in FIG. 2 includes an electron gun 1 that generates an irradiation electron beam 3 and a sample chamber 8. The sample chamber 8 is pumped by a vacuum exhaust system 301. A sample stage 10 on which the sample 9 is placed is disposed in the sample chamber 8. A secondary electron transfer electrode 102 is disposed between the deflectors 101, 103.

A spin detector 200 is pumped by a vacuum pumping system 302. A secondary electron transfer electrode 104 transfers the secondary electrons 5 to a target 201. An electron detector 203 detects signal electrons 202 scattered on the target 201.

In the apparatus configuration shown in FIG. 3, the sample 9 is disposed so as to face the spin detector 200 which is disposed obliquely with respect to the SEM optical axis 2.

In any one of the apparatus configurations, secondary electrons are guided to the target 201 of the spin detector 200 by a secondary electron transfer electrode (not shown in FIG. 3). A detection signal is obtained by detecting the electrons 202 scattered on the target 201 among the secondary electrons 5 guided to the target 201 of the spin detector 200.

Most of the known spin SEMs are equipped with a Mott detector as a spin detector. FIG. 4 shows a schematic diagram of a configuration of a detector near a target of the Mott detector. The Mott detector uses a heavy metal such as gold (Au) as the target 201 and causes the secondary electrons 5 accelerated to an energy of about 100 keV to collide with the target 201, so as to detect a spin of the secondary electrons 5.

At this time, the Mott detector uses a property that a scattering direction of electrons subjected to a spin-trajectory interaction in the target 201 differs depending on a spin direction of the electrons. The electrons 202 scattered on the target 201 are detected by detectors 203A to 203D disposed in individual directions, and the spin polarization can be measured as a vector amount by performing arithmetic processing.

Further, in a field of a photoelectron spectrophotometer, a very low energy electron diffraction (VLEED) detector is used as a detector having spin detection efficiency higher than the Mott detector. This spin detection method uses properties that an energy band structure inside a magnetized ferromagnetic material differs depending on the spin direction, and a probability of flying electrons absorbed inside a target differs depending on a magnetization direction of the target made of the ferromagnetic material and the spin direction of the electrons.

FIG. 5 shows an outline of a configuration of a detector near a target of the VLEED detector. In the VLEED detector, a single crystal film of a ferromagnetic material such as iron (Fe) is disposed as the target 201, and the secondary electrons 5 with energy of 10 eV or less are emitted. Around the target 201 made of the ferromagnetic material, coils 205A to 205D for controlling a magnetization direction of the target 201 and the detector 203 of electrons 202 scattered on the target 201 are disposed, and the spin polarization can be measured by changing the magnetization direction of the target 201 and detecting the electrons 202 scattered on the target 201.

In an example of a spin polarimeter, a sample is introduced from a load lock into a sample preparation chamber, is irradiated with an argon (Ar) ion beam for surface treatment, and then is transferred to an observation chamber equipped with an SEM housing.

A spin detector is the Mott detector, and is configured such that the SE with energy of several eV emitted from the sample by irradiation of an electron beam is emitted onto a gold (Au) target with energy of about 100 keV. The SE emitted from the sample is laterally deflected by a deflector disposed between the sample and an objective lens of the SEM, and is transferred to a spin detection chamber equipped with the Mott detector.

CITATION LIST

Patent Literature

PTL 1: JP-A-2015-50069

SUMMARY OF INVENTION

Technical Problem

Each chamber of the spin SEM is in an ultra-high vacuum, and in order to maintain the observation chamber and the spin detection chamber in the ultra-high vacuum, the sample is introduced from the load lock. Therefore, the sample that can be analyzed by the spin SEM is limited to one having a size that can be transferred from the load lock to the sample preparation chamber and the sample chamber using a transfer rod.

Further, in another example of the spin SEM, an elemental analytical apparatus such as an energy dispersive X-ray spectroscopy (EDS) or a wavelength dispersive X-ray spectroscopy (WDS) and a crystal orientation analyzer such as an electron backscatter diffraction (EBSD) are not mounted. Therefore, when an elemental analysis or a crystal orientation analysis is to be performed on the sample subjected to the spin analysis, it is necessary to perform the analysis by another apparatus equipped with these analytical apparatus. Further, in order to analyze the same field of view of the same sample by another apparatus, it is necessary to place an appropriate mark on the sample and pay attention to arrangement and an observation condition of the sample, which may cause difficulties.

Further, instead of the spin SEM described above, a normal SEM is disclosed in PTL 1. PTL 1 discloses a configuration of an analytical apparatus in which a focused ion beam apparatus (FIB) and an analyzer such as an EDS or an EBSD are mounted around an SEM housing. In recent years, in an analytical apparatus mainly formed of an SEM, there is a tendency to mount a large number of analyzers and attach importance to a function capable of performing a variety of sample analyzes in the same field of view. Since such an apparatus does not need to move the sample to another apparatus, it is advantageous that the same field of view can be easily identified in a process of sample analysis by individual analyzers, and no special measures such as atmosphere blocking are required.

Because the spin SEM in the related art has the above problems, an entire electron spin detector may be configured as an ultra-high vacuum apparatus in order to keep a target surface in a clean state. Due to the limitation, for example, the spin SEM in the related art is an apparatus whose sample chamber is in the ultra-high vacuum, and it is difficult to handle various sample sizes and analyze one sample in many respects by applying a plurality of analysis methods. Further, in a case of maintaining the ultra-high vacuum around the detector in the normal SEM, it is necessary to provide the ultra-high vacuum even in other vacuum regions connected to the detector, which requires a major apparatus modification. Therefore, it is difficult to detect a spin of secondary electrons using a normal SEM.

Solution to Problem

A spin polarimeter according to one aspect of the disclosure includes: a particle beam source or a photon beam source that is a probe for a sample; a sample chamber in which the sample is accommodated; a spin detector that includes a target to be irradiated with an electron generated from the sample by a particle beam or a photon beam from the probe, and a target chamber in which the target is accommodated, and is configured to detect a spin of the sample by detecting an electron scattered on the target; a first exhaust system that is configured to exhaust the sample chamber; a second exhaust system that is configured to exhaust the target chamber; and a differential orifice that is disposed between the target chamber and the sample chamber.

Advantageous Effect

According to one aspect of the disclosure, versatility of a spin polarimeter can be improved.

BRIEF DESCRIPTION OF DRAWINGS

FIG. 1 is a diagram showing a general energy distribution of signal electrons.
FIG. 2 is a diagram showing a detection principle of a Mott detector.
FIG. 3 is a diagram showing a detection principle of a VLEED detector.
FIG. 4 is a diagram showing an outline of a spin SEM according to the related art.
FIG. 5 is a diagram showing an outline of a spin SEM according to the related art.
FIG. 6 is a diagram showing an outline according to Embodiment 1.
FIG. 7 is a diagram showing an outline according to Embodiment 1.
FIG. 8A is a diagram showing an outline according to Embodiment 2.
FIG. 8B is a diagram showing an outline according to Embodiment 2.
FIG. 9 is a diagram showing an outline according to Embodiment 3.
FIG. 10 is a diagram showing an outline according to Embodiment 3.
FIG. 11 is a diagram showing an outline according to Embodiment 4.
FIG. 12 is a diagram showing an outline according to Embodiment 4.

DESCRIPTION OF EMBODIMENTS

Hereinafter, embodiments of the invention will be described with reference to the drawings. It should be noted that the present embodiment is merely an example for implementing the invention, and does not limit the technical scope of the invention. In the drawings, common components are denoted by the same reference numerals.

In the following, a spin polarimeter equipped with a spin detector for detecting a spin of charged particles emitted from a sample is disclosed. As an example of the spin polarimeter, a spin polarized scanning electron microscope (hereinafter referred to as spin SEM) will be shown. A differential exhaust structure of the disclosure can be applied to an apparatus different from the SEM, for example, an apparatus that irradiates a sample with a particle beam different from an electron beam or a photon beam (for example, X-rays or ultraviolet rays), such as a transmission electron microscope (TEM) or a focused ion beam (FIB). A particle beam source and a photon source are probes for the sample.

For an electron spin detector such as a Mott detector or a VLEED detector, the entire detector is configured as an ultra-high vacuum apparatus in order to keep a target surface in a clean state. Due to the limitation, for example, the spin SEM in the related art is an apparatus whose sample chamber is in the ultra-high vacuum, which makes it difficult to handle various sample sizes and analyze one sample in many respects by applying a plurality of analysis methods.

By analyzing one sample with different apparatus, the sample can be analyzed in many respects. However, when a magnetic material such as a steel material or a magnet is exposed to the atmosphere, a surface of the sample may be oxidized, and an oxide film may prevent an analysis of the outermost surface of the sample. In order to prevent exposure to the atmosphere when transferring the sample from one analytical apparatus to another analytical apparatus, it is necessary to take measures such as using a dedicated sample holder that can block the atmosphere.

Further, in order to analyze the same field of view when a sample is transferred to another analytical apparatus, it is necessary to place an appropriate mark near an analysis region, but different apparatus have different appearances of marks, which may make it difficult to analyze the same region.

Therefore, when the spin detector can be easily mounted on a general-purpose analytical SEM whose sample chamber is not in an ultra-high vacuum, it is expected that a surface of a magnetic sample can be analyzed in more detail than in the related art. However, it is impossible to mount a spin detector in the related art as it is on a general-purpose SEM that is often used in a sample chamber with a vacuum of about $10^{-4}$ Pa.

A configuration of a spin polarimeter disclosed below has a differential exhaust structure. One or more orifices are disposed between a vacuum chamber that stores the sample and a vacuum chamber that stores a target inside the spin detector. Due to the differential exhaust structure, an ultra-high vacuum (for example, $10^{-6}$ Pa or less) can be maintained around the target of the spin detector, and the sample chamber can maintain a vacuum (for example, $10^{-5}$ Pa or more) that is practically used in a sample chamber of a high-vacuum general-purpose scanning electron microscope.

According to the configuration disclosed herein, the spin detector can be connected to the sample chamber that is maintained at a vacuum of about $10^{-4}$ Pa during observation in the general-purpose analytical SEM. Typically, the spin detector can be mounted on the general-purpose analytical SEM with the vacuum on an order of $10^{-4}$ to $10^{-3}$ Pa in the sample chamber. An analysis in many respects can be performed by applying a plurality of analysis methods to the same field of view of the same sample without breaking the vacuum state during the analysis.

Further, since it is not necessary to transfer the sample between apparatuses, it is expected that a restriction on the sample size is reduced and an analysis time is shortened (higher throughput). Further, since the sample can be analyzed in a practical vacuum environment, a large-scale mechanism, which is a problem in a configuration based on an ultra-high vacuum apparatus, becomes unnecessary, and a cost of the apparatus can be reduced.

Embodiment 1

FIG. 6 shows a conceptual diagram of a configuration of an entire spin polarimeter according to an embodiment. The spin polarimeter shown in FIG. 6 roughly includes a scanning electron microscope (SEM), a spin detector 200, and a surface cleaning apparatus 11. The surface cleaning apparatus 11 is equipped with an apparatus having a function of cleaning a sample surface, such as an FIB equipped with an Ar ion gun, an Ar ion milling apparatus, and a metal liquid ion source of gallium (Ga).

The surface cleaning apparatus 11 is mounted in a sample chamber 8 in the configuration example shown in FIG. 6, but the apparatus may be configured such that the surface cleaning apparatus 11 is mounted in a vacuum chamber different from the sample chamber 8, and a sample 9 is introduced into the sample chamber 8 for analysis after a surface cleaning treatment of the sample 9.

The SEM includes an electron gun (electron source) 1 including a mechanism for irradiating the sample 9 with an irradiation electron beam 3, an electron optical system including a condenser lens and an objective lens 7 for focusing the irradiation electron beam 3 emitted from the electron gun 1, and a deflector (not shown) for scanning the sample 9 with the irradiation electron beam 3. The SEM further includes a sample stage 10 including a mechanism for moving the sample 9 to a desired position and inclining the sample 9 at a desired angle with respect to an SEM optical axis 2, a display apparatus (not shown) of an SEM image and a magnetic domain image (spin SEM image), a controller (not shown) for controlling the entire spin polarimeter including the electron optical system of the SEM and the spin detector 200, a vacuum pumping system (not shown), and the like.

FIG. 6 shows, in a system of the spin polarimeter, an irradiation system of the SEM, and a configuration in which secondary electrons 5 emitted from the sample 9 arrive at a target 201 of the spin detector 200 and electrons 202 scattered on the target 201 are detected by a detector 203.

The electron gun 1 have any configuration applicable to an electron microscope, similar to various electron guns used in existing SEMs, such as cold cathode field emission type, Schottky emission type, and thermionic emission type, and a photocathode that emits electrons by laser irradiation. As the electron gun 1, an appropriate electron gun is selected according to desired observation performance. For an apparatus used for a purpose of analyzing a spin polarization of a magnetic material sample, which is a main purpose of the present embodiment, it is preferable to use an electron gun in which a probe current amount of an irradiation electron beam is stably emitted for a long time.

Since a main analysis target in the spin polarimeter is a magnetic material sample, it is preferable that the objective lens 7 for focusing the irradiation electron beam 3 on the sample 9 is of a type in which a lens magnetic field leakage to the sample 9 is small. This is because, when an objective lens having a large leakage of a magnetic field is used, if a state of magnetization of the magnetic material sample changes due to the leakage of the magnetic field, accurate spin analysis results cannot be obtained.

In general, the objective lens in the electron microscope of a type having large intensity of the magnetic field leakage to the sample has a shorter focal length. Therefore, when a non-magnetic material sample or a sufficiently thin sample that is less affected by magnetization is observed, a magnetic field leakage type is desirable so as to obtain a high resolution. However, since a main configuration of the embodiment is the SEM and the purpose thereof is to perform a spin analysis of a bulk magnetic material sample, a so-called out-lens type objective lens that does not leak a magnetic field is desirable.

In recent years, for a purpose of observing a sample outermost surface, SEM observation performance at a low irradiation voltage of about 1 kV or less is often emphasized. In order to obtain a high resolution under such a low irradiation condition, an objective lens system, which applies a deceleration optical system such as a retarding method or a boosting method for decelerating an irradiation electron beam immediately in front of a sample, is used. When a deceleration field is distributed near the sample, secondary electrons may travel inside the objective lens of the SEM, and the spin detector 200, which will be described below in detail, may not be able to detect the secondary electrons. Therefore, it is necessary to pay attention to the configuration of the entire apparatus such that formation of the deceleration field does not hinder collection of the secondary electrons by the spin polarimeter.

A configuration of the spin detector 200 will be described below. In the present embodiment, similar to FIG. 3, a configuration example in which the sample 9 is disposed so as to be inclined with respect to the SEM optical axis 2 and is disposed so as to face the spin detector 200 will be described. However, the configuration for guiding the secondary electrons 5 to the spin detector 200 and the target 201 may be any of the configurations shown in FIGS. 2 and 3 used for showing a configuration outline of the existing spin SEM or any configuration similar thereto as long as a orifice and a differential exhaust structure described below in detail are appropriately applied.

Further, the spin detector 200 of the present embodiment described below is a VLEED detector using a target formed of a ferromagnetic material, but the spin detector 200 may be a Mott detector. No matter the spin detector 200 is a VLEED detector or a Mott detector, essential configurations of the other parts are similar.

A typical pressure of the sample chamber 8 of the SEM in which the sample 9 is placed is $10^{-3}$ Pa to $10^{-4}$ Pa. The pressure of the sample chamber 8 of the SEM depends on a size of an internal space of the sample chamber 8 and a pumping speed of a vacuum pumping system 301 connected to the sample chamber 8. Depending on the sample 9 placed in the sample chamber 8, some may emit gas by electron beam irradiation. Therefore, even if the pressure is on an order of $10^{-4}$ Pa in a state where the sample 9 is not placed, the pressure may deteriorate during the spin analysis. Therefore, it is necessary to assume that the pressure of the sample chamber 8 is about $10^{-3}$ Pa.

On the other hand, a typical pressure required for a target chamber 210 in which the target 201 of the spin detector 200 is placed is $10^{-6}$ Pa to $10^{-7}$ Pa. Therefore, it is necessary to configure the differential exhaust structure such that a pressure difference of at least 2 to 3 digits can be maintained between the sample chamber 8 and the target chamber 210.

In particular, during the spin analysis, even in the differential exhaust structure, gas molecules flow into the target chamber 210 having a low pressure through the orifice. Considering a situation where the pressure difference is the largest, it is necessary to configure the differential exhaust structure so as to maintain the pressure difference of about 4 digits.

FIG. 6 shows a configuration in which an orifice 401 is mounted between the target chamber 210 and a connection chamber 212 connected to the SEM sample chamber 8 inside the spin detector. The orifice 401 that divides two vacuum spaces is set to have a diameter of, for example, φ0.1 mm to φ0 mm according to a pressure difference between the chambers on both sides thereof. In order to maintain a larger pressure difference, it is desirable to apply the orifice 401 having a small diameter to reduce conductance as well as inflow and outflow of gas molecules. The target chamber 210 is exhausted by a vacuum pumping system 402 different from the vacuum pumping system 301 of the sample chamber with the orifice 401 as a boundary.

In an actual configuration, it may be difficult to maintain the pressure difference of about 4 digits by one orifice. Therefore, as shown in FIG. 7, the spin polarimeter may have a configuration in which two orifices 401A, 401B are mounted between the connection chamber 212 connected to the sample chamber 8 and the target chamber 210. An intermediate chamber 211 sandwiched between the two orifices 401A, 401B is configured between the connection chamber 212 connected to the sample chamber 8 and the target chamber 210.

The intermediate chamber 211 and the target chamber 210 are connected to the vacuum pumping system 402 and a vacuum pumping system 403, respectively. When a chamber is further connected and three or more orifices are mounted in the configuration, it is possible to obtain a structure in which a larger pressure difference can be easily maintained between the sample chamber 8 and the target chamber 210.

The secondary electrons 5 emitted from the sample 9 are collected and transferred by a transfer electrode (not shown in FIG. 7) inside the spin detector, and are guided to the target 201 through the two orifices 401A, 401B. A magnetization direction of the target 201 is controlled by a coil 205. The electrons 202 scattered on the target 201 are detected by the electron detector 203.

As described with reference to FIG. 5, when the spin detector 200 is a VLEED detector, the spin detector 200 can control the magnetization direction by coils 205A to 205D disposed around the target 201, and measure the spin polarization by processing a detection signal from the electron detector 203 with respect to each magnetization direction of a ferromagnetic material serving as the target 201.

As described with reference to FIG. 4, when the spin detector 200 is a Mott detector, the spin detector 200 can detect the electrons 202 scattered on the target 201 by detectors 203A to 203D disposed around the target 201, and measure the spin polarization by processing a detection signal.

Embodiment 2

FIG. 8A shows a conceptual diagram of a configuration of an entire spin polarimeter of the present embodiment. In the following description, differences from the other embodiments will be mainly described. One difference between Embodiment 1 and the present embodiment is that, for each of the orifices 401A, 401B mounted inside the spin detector, secondary electron focus lenses 501A, 501B for focusing the secondary electrons 5 emitted from the sample are added.

Another difference is that, in order to deal with a case where a trajectory of the secondary electrons 5 is deflected by an unintentional magnetic disturbance, alignment mechanisms 502A, 502B for adjusting the trajectory are mounted such that the secondary electrons 5 are focused on the orifice.

As shown in FIG. 1, since the secondary electrons 5 have an energy distribution and have an angular distribution when being emitted from a sample, the secondary electrons 5 that pass through a focus lens do not focus to a single point due to an effect of an aberration. Further, the spin SEM can also be used for low-magnification observation with a magnification of about 100 times (converted to an angle of view of an observation field of about 100 µm on one side) by setting a large scanning range of the irradiation electron beam 3 of the SEM.

Therefore, it is important to efficiently transfer the secondary electrons 5 generated in a wide range on the sample to the target 201. The spin polarimeter is equipped with the focus lenses 501A, 501B for the secondary electrons 5, and controls an electron optical system of the spin detector such that a focal point is provided near an opening of each of the orifices 401A, 401B. For example, the focal point is positioned between a point in front of the opening of the orifice by an opening diameter and a point in the back by the opening diameter.

In particular, in a case where a small orifice is used in consideration of conductance, when the secondary electrons 5 are partially blocked by the orifices 401A, 401B, an arrival rate of the secondary electrons 5 to the target 201 decreases, and signal detection efficiency of the spin detector 200 decreases. In order to avoid such a situation and obtain an efficient spin detector, a configuration incorporating a secondary electron focus lens system is effective.

It is desirable that the lenses 501A, 501B for focusing the secondary electrons 5 mounted on the spin detector 200 are electrostatic lenses that apply a voltage to electrodes to obtain a lens effect so as to preserve a spin direction of the secondary electrons 5 when passing through the lens. Since the electrostatic lens can be made compact as compared with a magnetic field lens, the entire spin detector 200 can be made compact.

Further, a voltage, which is applied to an electrode mounted between the sample 9 and an orifice disposed at a position closest to the sample 9 in the spin detector 200, is applied such that a potential of the electrode is higher than that of the sample by, for example, 1 kV or more. Accordingly, a lens field necessary for transferring the secondary electrons 5 to the target 201 of the spin detector 200 with high efficiency can be formed. This is because by making the potential of the electrode higher than the potential of the sample, energy of the secondary electrons passing through the orifice can be increased, and the secondary electrons emitted from the sample 9 in a wide angle range and a wide distance range can pass through the orifice with good focusing property.

In a case where an adverse effect of an aberration caused by an electron beam passing through the lens is ignored, when a maximum angle of the electrons with an optical axis of the detector is $\theta$, a maximum off-axis distance of the electrons from the optical axis of the detector is R, and energy of the electrons is E, $\theta*R*E^{1/2}$ is a conserved amount for each exit point or each focal point. The conserved amount is known as the Helmholtz-Lagrange invariant, and is also called a paraxial invariant because the conserved amount is coincident with a paraxial trajectory in electron optics. According to this law, a product of the angle $\theta$ and the off-axis distance R ($\theta*R$) becomes smaller as the energy of the electrons becomes larger, and a condition that the focusing property of the secondary electrons is good can be obtained.

In order to obtain a highly efficient spin detector, it is important to reduce a blocking amount of the secondary electrons by the orifice when the secondary electrons pass through the orifice. For that purpose, it is desirable to satisfy the condition that the focusing property of the secondary electrons is good. In order to obtain the condition, a configuration is effective in which the orifice is incorporated as a part of lens electrodes, and a voltage is applied to the electrode such that a potential of the electrode is 1 kV or more higher than the potential of the sample.

FIG. 8B shows an example of an apparatus configuration in a case where apart of the lens electrodes is configured as the orifice as described above. Similar to the configuration of FIG. 8A, the configuration causes the secondary electrons 5 generated from the sample 9 to be focused near an orifice 401C using the focus lens 501A. The orifice 401C also functions as a lens electrode, and the focus lenses 501A, 501B are disposed in front of and behind the lens electrode (orifice) 401C.

An off-axis amount when the secondary electrons 5 pass through the orifice 401C can be made sufficiently smaller than a throttle diameter by applying, for example, a positive voltage of 1 kV to the lens electrode (orifice) 401C with respect to the sample 9 on a ground potential. Accordingly, the arrival rate of the secondary electrons 5 on the target 201 can be increased as compared with a case where no voltage is applied to the orifice or lens electrode 401C.

In a case of a differential exhaust structure having two or more orifices in the spin detector, the spin detector with high detection efficiency can be obtained by configuring a lens electrode immediately in front of each orifice so as to focus the secondary electrons on the orifices and on the target.

When two or more orifices are provided, it is important to improve the focusing property of the secondary electrons especially in the first orifice. This is because, when the secondary electrons are focused by the lens, the focusing property is deteriorated due to the adverse effect of the aberration of the lens is accumulated at the later focal point. Therefore, in order to achieve both the differential exhaust structure and the spin detector with high detection efficiency as described above, it is effective to make the secondary electrons pass through the orifice having a diameter as small as possible under a condition of the best focusing property. When two or more orifices are provided, the throttle diameter may be increased toward the subsequent stage.

It is desirable that the alignment mechanisms 502A, 502B for adjusting the trajectory of the secondary electrons 5 are electrostatic deflectors that apply a voltage to the electrode to obtain a deflection action such that the spin direction of the secondary electrons 5 is preserved as the secondary electrons 5 pass through the deflectors. The simplest configuration of the deflector is formed of electrodes obtained by dividing a cylindrical electrode into four or eight parts symmetrically with respect to an axis of the detector.

Embodiment 3

FIG. 9 shows a conceptual diagram of a configuration of an entire spin polarimeter of an embodiment. In the following description, differences from the other embodiments will be mainly described. One difference between the present embodiment and the Embodiment 1 is that a spin rotator 106 is mounted in any region between the sample chamber 8 and the target chamber 210.

A function of the spin rotator 106 is obtained by mounting a so-called Wien filter 504. The Wien filter 504 applies a deflection electric field and a deflection magnetic field in a direction orthogonal to each other and in a direction crossing an optical axis of a spin detector.

In arrangement shown in FIGS. 6 to 8, when a VLEED detector configured as the spin detector such that axes of two pairs of coils are orthogonal to each other around a target is mounted, magnetization in a sample surface can be analyzed, but magnetization in a direction perpendicular to the sample surface cannot be analyzed. In order to perform the magnetization analysis in the direction perpendicular to the sample surface, before the secondary electrons 5 emitted from the sample 9 arrive at the target 201, the spin rotator 106 is used to rotate the spin direction of the secondary electrons 5 by 90 degrees. As described above, by mounting the spin rotator 106, three-dimensional magnetization analysis of the sample becomes possible.

As shown in FIG. 10, without mounting the spin rotator 106, two sets of surrounding structures including the target 201 and the electron detector 203 of the spin detector 200 are prepared, one of which may be disposed similarly to FIG. 6, and the other may be disposed at a position deflected by 90 degrees.

In the present embodiment, in order to make the spin detector more efficient, a configuration equipped with a focus lens and an alignment mechanism is effective. That is, the spin rotator 106 may be combined between the sample 9 and the target 201 at a rear stage portion of the spin detector equipped with the focus lens as shown in FIGS. 8A and 8B. With such a configuration, a spin SEM, which has high differential exhaust performance and highly efficient spin detection performance and is capable of a three-dimensional magnetic domain structure analysis, can be obtained.

Embodiment 4

FIGS. 11 and 12 show conceptual diagrams of configurations of an entire spin polarimeter of the present embodiment. In the following description, differences from the other embodiments will be mainly described. One of the differences between the present embodiment and the other embodiments is that an energy analyzer 505 or 506 is mounted in a region immediately in front of the target chamber 210.

Energy analyzers are roughly classified into a cylindrical mirror analyzer (hereinafter referred to as CMA) in which cylindrical electrodes are disposed in parallel, and a concentric hemispherical analyzer (hereinafter referred to as CHA). The energy analyzer 505 having the configuration shown in FIG. 11 is a CMA, and the energy analyzer 506 having the configuration shown in FIG. 12 is a CHA. In general, the CHA 506 has an energy resolution higher than that of the CMA 505.

Since an energy band of the secondary electrons 5 that collide with the target 201 can be limited by mounting the energy analyzer 505 or 506, more precise magnetization measurement is possible.

In the present embodiment, in order to make the spin detector more efficient, a configuration equipped with a focus lens and an alignment mechanism is effective. That is, an energy analyzer may be combined between the sample 9 and the target 201 at a rear stage portion of the spin detector equipped with the focus lens as shown in FIGS. 8A and 8B. With such a configuration, in addition to the high differential exhaust performance and the highly efficient spin detection performance, a spin SEM image having higher contrast can be obtained since irradiation energy to the target 201 is limited.

The invention is not limited to the embodiments described above, and includes various modifications. For example, the embodiments described above are described in detail for easy understanding of the invention, and the invention is not necessarily limited to those including all the configurations described above. Further, a part of the configuration of one embodiment can be replaced with the configuration of another embodiment, and the configuration of another embodiment can be added to the configuration of one embodiment. Further, another configuration may be added to a part of the configuration of each embodiment, and the part of the configuration may be deleted or replaced with another the configuration.

Further, each of the above-described configurations, functions, process units, and the like may be partially or entirely implemented by hardware such as through design using an integrated circuit. The above-described configurations, functions, and the like may also be implemented by software by means of interpreting and performing a program, by a processor, for implementing respective functions. Information of programs, tables, files or the like for implementing each function can be placed in a recording apparatus such as a memory, a hard disk, and a solid state drive (SSD), or a recording medium such as an IC card, an SD card.

Further, control lines and information lines show those considered to be necessary for the description, and not all the control lines and the information lines are necessarily shown on the product. In practice, it may be considered that almost all the configurations are connected to each other.

The invention claimed is:

1. A spin polarimeter, comprising:
    a particle beam source or a photon beam source that is a probe for a sample;
    a sample chamber in which the sample is accommodated;
    a spin detector that includes a target to be irradiated with an electron generated from the sample by a particle beam or a photon beam from the probe, and a target chamber in which the target is accommodated, and is configured to detect a spin of the sample by detecting an electron scattered on the target;
    a first exhaust system that is configured to exhaust the sample chamber;
    a second exhaust system that is configured to exhaust the target chamber; and
    an orifice that is disposed between the target chamber and the sample chamber.

2. The spin polarimeter according to claim 1, wherein the probe is an electron source, and
    an electron optical system for focusing an electron emitted from the electron source on the sample, and further scanning the sample with the electron emitted from the electron source is further provided in the sample chamber.

3. The spin polarimeter according to claim 1, wherein the sample chamber is maintained at a pressure of $10^{-5}$ Pa or more, and the target chamber is maintained at a pressure of $10^{-6}$ Pa or less during a sample analysis.

4. The spin polarimeter according to claim 1, further comprising:
    a lens disposed on a sample side of the orifice and for focusing the electron generated from the sample.

5. The spin polarimeter according to claim 4, further comprising:
    a plurality of orifices; and
    a lens disposed on a sample side of each of the plurality of orifices and for focusing the electron generated from the sample.

6. The spin polarimeter according to claim 1, wherein the orifice is configured as a part of a lens electrode, and a voltage is applied from the outside.

7. The spin polarimeter according to claim 6, further comprising:
    a plurality of orifices, wherein
    a potential of at least one lens electrode disposed between the sample and an orifice disposed at a position closest to the sample is larger than a potential of the sample by 1 kV or more.

8. The spin polarimeter according to claim 1, further comprising:
    an alignment mechanism disposed closer to a sample side than the orifice such that the electron generated from the sample passes through the orifice, and configured to adjust a trajectory of the electron generated from the sample.

9. The spin polarimeter according to claim 1, further comprising:
    a spin rotator disposed between the sample and the target.

10. The spin polarimeter according to claim 1, further comprising:

an energy analyzer disposed between the sample and the target.

11. The spin polarimeter according to claim 1, wherein the spin detector is a Mott type spin detector using a heavy metal as the target.

12. The spin polarimeter according to claim 1, wherein the spin detector is a very low energy electron diffraction (VLEED) type spin detector using a ferromagnetic material as the target.

13. The spin polarimeter according to claim 12, wherein the spin detector uses an iron single crystal film as the target.

* * * * *